United States Patent
McDonald

(10) Patent No.: US 8,368,478 B2
(45) Date of Patent: Feb. 5, 2013

(54) INTEGRATED CIRCUIT FREQUENCY GENERATOR

(75) Inventor: John Othniel McDonald, Mountain House, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

(21) Appl. No.: 12/658,765

(22) Filed: Feb. 12, 2010

(65) Prior Publication Data

US 2010/0214030 A1   Aug. 26, 2010

Related U.S. Application Data

(60) Provisional application No. 61/207,648, filed on Feb. 13, 2009.

(51) Int. Cl.
*H03L 1/02* (2006.01)
*H03L 7/00* (2006.01)

(52) U.S. Cl. .............. 331/176; 331/18; 331/34; 331/44; 331/60

(58) Field of Classification Search ................ 331/2, 18, 331/34, 44, 46, 51, 60, 61, 74, 176
See application file for complete search history.

(56) References Cited

U.S. PATENT DOCUMENTS

| | | | |
|---|---|---|---|
| 4,325,036 A * | 4/1982 | Kuwabara | 331/176 |
| 5,867,524 A | 2/1999 | Booth et al. | |
| 6,304,517 B1 | 10/2001 | Ledfelt et al. | |
| 6,728,234 B1 | 4/2004 | Hoffmann et al. | |
| 6,888,413 B1 | 5/2005 | Adams et al. | |
| 6,985,811 B2 * | 1/2006 | Gronemeyer | 701/213 |
| 7,015,762 B1 | 3/2006 | Nicholls et al. | |
| 7,068,113 B2 | 6/2006 | Jasa et al. | |
| 7,216,249 B2 * | 5/2007 | Fujiwara et al. | 713/501 |
| 2002/0066001 A1 | 5/2002 | Olarig et al. | |
| 2005/0258906 A1 | 11/2005 | Su et al. | |
| 2008/0278244 A1 | 11/2008 | Wang et al. | |

* cited by examiner

*Primary Examiner* — Levi Gannon
(74) *Attorney, Agent, or Firm* — Van Pelt, Yi & James LLP

(57) ABSTRACT

An integrated circuit frequency generator is disclosed. In some embodiments, the frequency generator comprises an electronic oscillator configured to generate an oscillator frequency, calibration circuitry configured to periodically calibrate the electronic oscillator with respect to a reference frequency at a first calibration frequency when at a steady state temperature and at a second calibration frequency when at a transient temperature, and circuitry configured to generate an output frequency from the oscillator frequency.

55 Claims, 3 Drawing Sheets

INTEGRATED CIRCUIT FREQUENCY GENERATOR

CROSS REFERENCE TO OTHER APPLICATIONS

This application claims priority to U.S. Provisional Patent Application No. 61/207,648 entitled GREEN CLOCKS filed Feb. 13, 2009 which is incorporated herein by reference for all purposes.

BACKGROUND OF THE INVENTION

Quartz crystals are typically employed as frequency sources in electronic systems due to their outstanding performance characteristics such as excellent accuracy, stability, phase noise, and aging characteristics. Crystals are also quite inexpensive but are relatively large in size. Semiconductor-based solutions, such as phase-locked loops, may also be employed for frequency generation. Phase-locked loop based clock sources offer some advantages over crystals such as faster turn-on, smaller size, and lower cost. Moreover, phase-locked loop based clock sources can operate in a spread-spectrum mode to reduce noise generation. However, compared to crystals, phase-locked loops consume much more power and in some cases may introduce unacceptable levels of phase noise and/or jitter. Typical implementations of other semiconductor-based solutions such as electronic oscillators in many cases also generate unacceptable levels of phase noise. Consequently, crystals have remained prevalent as frequency sources in electronic systems.

Existing electronic systems typically include a plurality of crystals from which to generate required system frequencies under various operating conditions. For example, devices such as media players, digital cameras, cell phones, PDAs, etc., typically include 2-5 crystal based frequency sources; and a notebook computer typically includes as many as nine crystal based frequency sources. An electronic system typically includes at least one low frequency crystal. For example, most systems include a 32.768 kHz crystal since this frequency has become the de facto standard time base for real time calendar and clock circuitry, which is commonly found in most electronic devices. Moreover, most systems also include one or more high frequency crystals, e.g., to generate frequencies in the megahertz range. No viable techniques currently exist for eliminating the need for a plurality of crystal frequency sources in electronic systems.

BRIEF DESCRIPTION OF THE DRAWINGS

Various embodiments of the invention are disclosed in the following detailed description and the accompanying drawings.

DETAILED DESCRIPTION

Figure 1A:
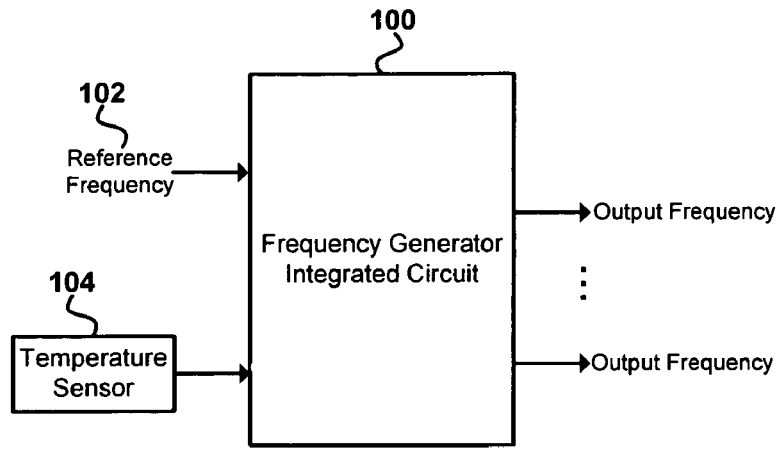
FIG. 1A illustrates a high level block diagram of an embodiment of a frequency generator integrated circuit.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

An integrated circuit frequency generator calibrated with a single high accuracy reference frequency is disclosed. The frequency generator described herein may be employed to generate multiple clock frequencies using semiconductor technology and one crystal (or other high accuracy) frequency source rather than a plurality of crystals in systems that require a plurality of clock signals of various frequencies. The frequency generator integrated circuit provides at least comparable and in many cases improved performance compared to the plurality of crystal based frequency sources typically found in most systems and provides many additional benefits. For example, the frequency generator integrated circuit may be configured to generate one or more clock frequencies having accuracies comparable to crystal based frequency sources and at lower power consumption. Moreover, the frequency generator integrated circuit generates clocks having significantly (e.g., 10×) faster turn-on times. A quicker turn-on not only provides a faster response but also consumes less power. Furthermore, the frequency generator integrated circuit reduces component count by eliminating several components in tight routing areas of a printed circuit board. The frequency generator integrated circuit consolidates several components needed to generate various clock frequencies into a single chip and thus consumes significantly less board space for clock frequency generation. For example, the frequency generator integrated circuit may be packaged in a QFN package, WL-CSP package, or other chip scale package. In many cases, the frequency generator integrated circuit occupies an area less than the size of a single crystal while eliminating the need for several crystals. In addition, the frequency generator integrated circuit can be provided at lower cost than a plurality of crystal based sources. In various embodiments, the disclosed frequency generator integrated circuit may be configured to generate any one or more output frequencies. For example, the frequency generator integrated circuit may be configured to generate low frequencies having high accuracy but at comparable or in many cases significantly lower power than low frequency crystals. The frequency generator integrated circuit may also be configured to directly generate one or more high frequencies, eliminating the need for additional phase-locked loops in an associated system for generating high frequency internal clocks. Most notably, the frequency generator integrated circuit can be configured to introduce little and/or no significant phase noise in most systems.

Figure 1B:
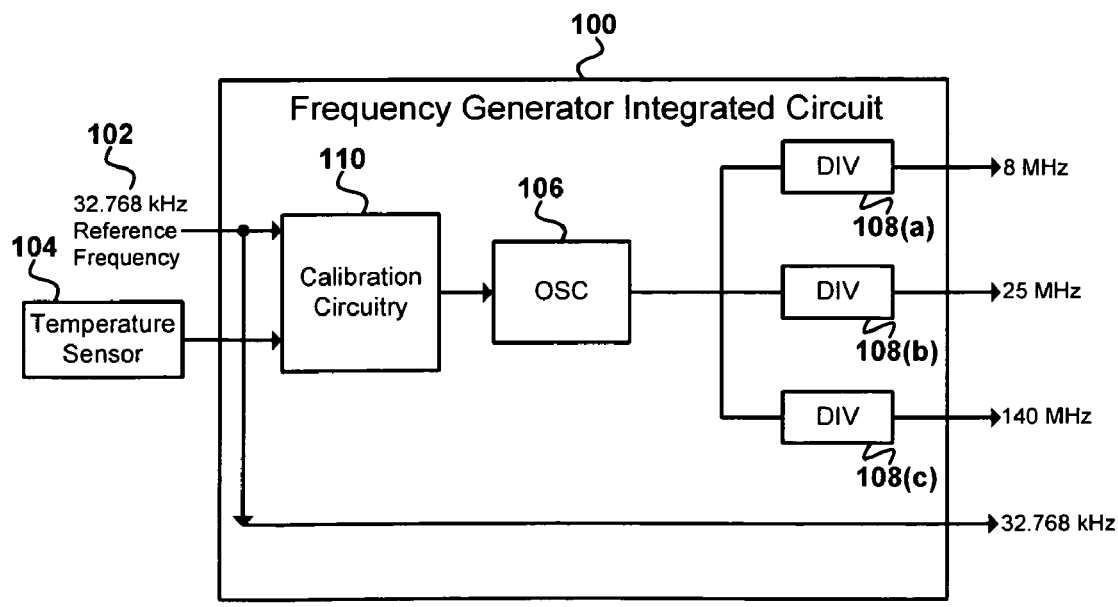
FIG. 1B illustrates a high level functional block diagram of components comprising an embodiment of a frequency generator integrated circuit.

FIGS. 1A-1B illustrate high level functional block diagrams of embodiments of a frequency generator integrated circuit that generates one or more frequencies using a single reference frequency. Although a 32.768 kHz reference frequency and a particular integrated circuit configuration to generate various frequencies including frequencies in the megahertz range are described in some of the given examples, the disclosed techniques may be similarly employed with respect to any other appropriate reference frequency and integrated circuit configuration to generate any one or more desired clock frequencies.

FIG. 1A illustrates a high level block diagram of an embodiment of a frequency generator integrated circuit. In the given example, frequency generator integrated circuit 100 employs reference frequency 102 to generate one or more output clock frequencies. As depicted, all output frequencies are based on reference frequency 102. Thus, in some embodiments, only a single high accuracy reference frequency source is needed in an associated system to generate the various frequencies needed by the system using frequency generator integrated circuit 100. In some embodiments, frequency generator integrated circuit 100 uses an electronic oscillator to generate one or more output frequencies.

Compared to a crystal, however, an untrimmed electronic oscillator is inherently a relatively unstable and inaccurate device due to its low quality factor (Q) and typically has an error on the order of +/−20000 ppm and higher. An electronic oscillator is also highly sensitive to thermal variations. For example, several hundred ppm of frequency error typically results for each degree Celsius change in temperature of an associated integrated circuit. As a result, the electronic oscillator of frequency generator 100 is periodically trimmed to correct for drift using highly accurate reference frequency 102 in order to ensure that the output frequencies of frequency generator 100 have at least a prescribed accuracy (e.g., +/−50 ppm of error).

As further described below, in some embodiments, the electronic oscillator is calibrated at a relatively low calibration frequency (e.g., less than a few Hz) so that the calibration rate of the oscillator and/or any associated harmonics do not introduce any significant phase noise at or near other important system frequencies. In many cases, a low calibration frequency is sufficient to compensate for long term drift of the oscillator but may be too slow for short term drift which may result, for example, from abrupt temperature gradients. In some embodiments, as further described below, short term drifts are compensated by temporarily increasing the calibration frequency (e.g., into the MHz range) for a short period of time. Because a high calibration frequency is activated only very briefly and in most cases infrequently, e.g., to compensate for fast thermals, any phase noise introduced at or near other important system frequencies due to the high calibration frequency and/or any associated harmonics is negligible and tolerable in most cases. Data measured by temperature sensor 104 is employed to identify thermal transients and appropriately adjust the calibration rate as needed.

FIG. 1B illustrates a high level functional block diagram of components comprising an embodiment of frequency generator 100. In the given example, only the components and/or connections relevant to describing the functionality of frequency generator 100 are depicted. In various embodiments, frequency generator 100 may comprise any other and/or different components and/or configuration to provide the described functionality. As depicted, frequency generator 100 includes an electronic oscillator 106 configured to output an oscillator frequency. The oscillator frequency is divided using frequency dividers 108 to generate output frequencies ranging from 8-140 MHz in the given example. Oscillator 106 is periodically calibrated by calibration circuitry 110 to track the accuracy of 32.768 kHz reference frequency 102. In some embodiments, the frequency at which calibration circuitry 110 trims oscillator 106 is increased in response to thermal transients, which are identified from temperature data measured by temperature sensor 104. Various components of frequency generator 100 are described in further detail below.

In various embodiments, oscillator 106 may comprise any appropriate electronic oscillator or equivalent electronic circuit. For example, oscillator 106 may comprise a ring oscillator, a DCO (digitally-controlled oscillator), a VCO (voltage-controlled oscillator), etc. In some embodiments, oscillator 106 comprises an LC VCO, e.g., because an LC VCO is one of the highest Q devices that can be built in silicon. In various embodiments, an oscillator having any desired configuration, characteristics, and/or frequency may be selected based on the needs of the application and/or process geometry. In some embodiments, oscillator 106 comprises a very high frequency (e.g., gigahertz) oscillator. For example, oscillator 106 may comprise a 1.6 GHz LC VCO.

Oscillator 106 is used to generate one or more output clock frequencies needed by an associated system or a component of an associated system. In the given example, the output of oscillator 106 is divided by frequency dividers 108 to generate a plurality of output clock frequencies in the megahertz range. One or more of frequency dividers 108 may comprise fractional-n dividers to achieve a proper divide ratio. In some embodiments, a voltage level of an output frequency is adjusted using an independently powered output buffer (not shown in the given figure). In some embodiments, an output frequency drive level is programmable. In various embodiments, an output frequency having any desired value may be generated from the output of oscillator 106 using any appropriate circuitry, such as frequency multipliers, frequency dividers, frequency-locked loops, phase-locked loops, etc. Frequency generator 100 also outputs the 32.768 kHz reference frequency 102. In various embodiments, frequency generator 100 may be configured to generate or output any number of copies of any one or more frequencies.

In the example of FIG. 1B, reference frequency 102 comprises 32.768 kHz but may comprise any frequency in other embodiments. In some embodiments, reference frequency 102 has a relatively high accuracy (e.g., +/−20 ppm of error). In some embodiments, it may be desirable for reference frequency 102 to be a low frequency, e.g., because a low frequency can be generated at very low power and can be fanned out and routed across a board without introducing any significant electromagnetic interference (EMI). In some embodiments, reference frequency 102 may be directly generated from a crystal source of that frequency, e.g., 32.768 kHz reference frequency 102 may be generated from a 32.768 kHz crystal. In some embodiments, reference frequency 102 may be generated using a crystal source of a different frequency, e.g., 32.768 kHz reference frequency 102 may be generated using a 131.072 kHz crystal and divide-by-four frequency divider. In some embodiments, 32.768 kHz reference frequency 102 comprises an output of another integrated circuit that generates the 32.768 kHz output using a high frequency (e.g., megahertz) crystal source. Instead of a quartz crystal, any other high accuracy frequency source may be employed in various embodiments to produce reference frequency 102.

In some embodiments, reference frequency 102 comprises a temperature error-corrected frequency. A crystal or other reference frequency source may have a non-linear temperature versus error curve. For example, a 32.768 kHz tuning fork crystal has an inverted parabolic temperature versus error curve around a turnover temperature of around 25° C. at which the lowest error occurs (e.g., approximately +/−20 ppm). A current temperature measured by temperature sensor 104 may be employed to correct for temperature error such that reference frequency 102 has a nearly linear accuracy (e.g., +/−20 ppm of error) over all temperatures. In various embodiments, circuitry to correct temperature error in the reference frequency may be included anywhere in an associated system. In some cases, for example, the circuitry is integrated in real time calendar/clock (RTC) circuitry, and reference frequency 102 is output from the RTC circuitry. In various embodiments, reference frequency 102 may or may not be temperature error-corrected. In some cases, an output frequency having an accuracy of approximately +/−50 ppm of error can be generated by oscillator 106 if it is tuned using a temperature error-corrected reference frequency 102. However, in some cases, an output frequency having an accuracy of approximately +20/−180 ppm of error can be generated by oscillator 106 if it is tuned by a reference frequency 102 that is not temperature error-corrected, which is acceptable for many applications.

Oscillator 106 drifts over time and temperature. In order for the output frequencies generated using oscillator 106 to have acceptable levels of accuracy (e.g., on the order of +/−50 ppm of error or lower), oscillator 106 is periodically calibrated by calibration circuitry 110 to track the accuracy of reference frequency 102. In various embodiments, calibration circuitry 110 may be implemented in any appropriate manner and may comprise any appropriate components such as counters, comparators, frequency-locked loops, phase-locked loops, etc. In some cases, for example, calibration circuitry 110 may include circuitry to count and/or compare the pulses output by oscillator 106 and the pulses of reference frequency 102 to determine the frequency error of oscillator 106. Calibration circuitry 110 may also include circuitry to appropriately tune oscillator 106 to correct any identified frequency error. Any of a variety of trimming techniques known in the art may be employed to trim oscillator 106. For example, a capacitor array connected to oscillator 106 may be appropriately adjusted to correct the frequency error of oscillator 106. In this example, adding more capacitance to oscillator 106 decreases its frequency while removing capacitance from oscillator 106 increases its frequency. In some embodiments, a frequency-locked loop is employed to lock oscillator 106 to reference frequency 102. Calibration circuitry 110 may also include circuitry for programming, selecting, and/or adjusting the calibration frequency of oscillator 106. In various embodiments, the calibration frequency can be dynamically adjusted, left fixed, or tuned. In some embodiments, calibration circuitry 110 is configured to tune oscillator 106 at a very low calibration frequency (e.g., 0.5-2 Hz or even lower) to avoid introducing phase noise at or near other important system frequencies but also configured to temporarily increase to a very high calibration frequency (e.g., in the megahertz range) for a short time period during fast thermals. Temperature transients are identified from temperature data measured by temperature sensor 104. Although depicted as a single block in FIG. 1B for illustration, calibration circuitry 110 may comprise one or more independent components in various embodiments. For example, the same and/or different circuitry may be employed for slow and fast calibration in various embodiments.

FIG. 1B illustrates one embodiment of a manner in which a frequency generator integrated circuit may at least in part be implemented. In other embodiments, frequency generator 100 may be implemented and/or configured in any manner such that it provides the basic functionality of using a single high accuracy reference frequency to generate any output clock frequency having high accuracy and at low power consumption but without introducing any significant or unacceptable phase noise in an associated system. For example, a low frequency (e.g., kilohertz) crystal that already has use and exists in an associated system can be employed to calibrate an oscillator with single or multiple outputs to high accuracy; and a low cost, low power, high performance output frequency is generated if the calibration of the oscillator is performed outside a phase noise bandwidth of interest.

Figure 2:
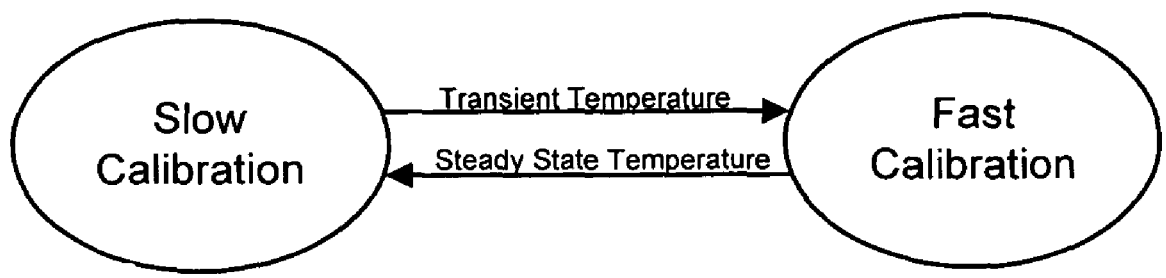
FIG. 2 illustrates an embodiment of a state diagram for calibrating the oscillator of a frequency generator integrated circuit.

FIG. 2 illustrates an embodiment of a state diagram for calibrating the oscillator of frequency generator 100. At a steady state temperature, the oscillator is calibrated at a slow calibration frequency, e.g., 0.5 Hz. However, during a transient temperature, the oscillator is calibrated at a fast calibration frequency, e.g., a MHz frequency. In various embodiments, any calibration frequency that is outside a phase noise bandwidth of interest in an associated system may be selected for calibrating the oscillator at steady state temperature. In some cases, if the calibration frequency for steady state temperature is high enough to correct for fast thermals, the calibration frequency need not be increased or changed and temperature transients need not be detected in some embodiments.

As described, in some embodiments, a high accuracy kilohertz clock (i.e., reference frequency 102) is employed to generate high performance megahertz clocks throughout a system. The high accuracy kilohertz clock may be generated using any frequency source, such as a crystal. In some embodiments, the high accuracy kilohertz clock is generated at very low power using another integrated circuit. The low power, high accuracy kilohertz clock may be networked around a board to calibrate a plurality of oscillator-based frequency generators 100 that are located near the components for which they generate clock frequencies.

Figure 3:
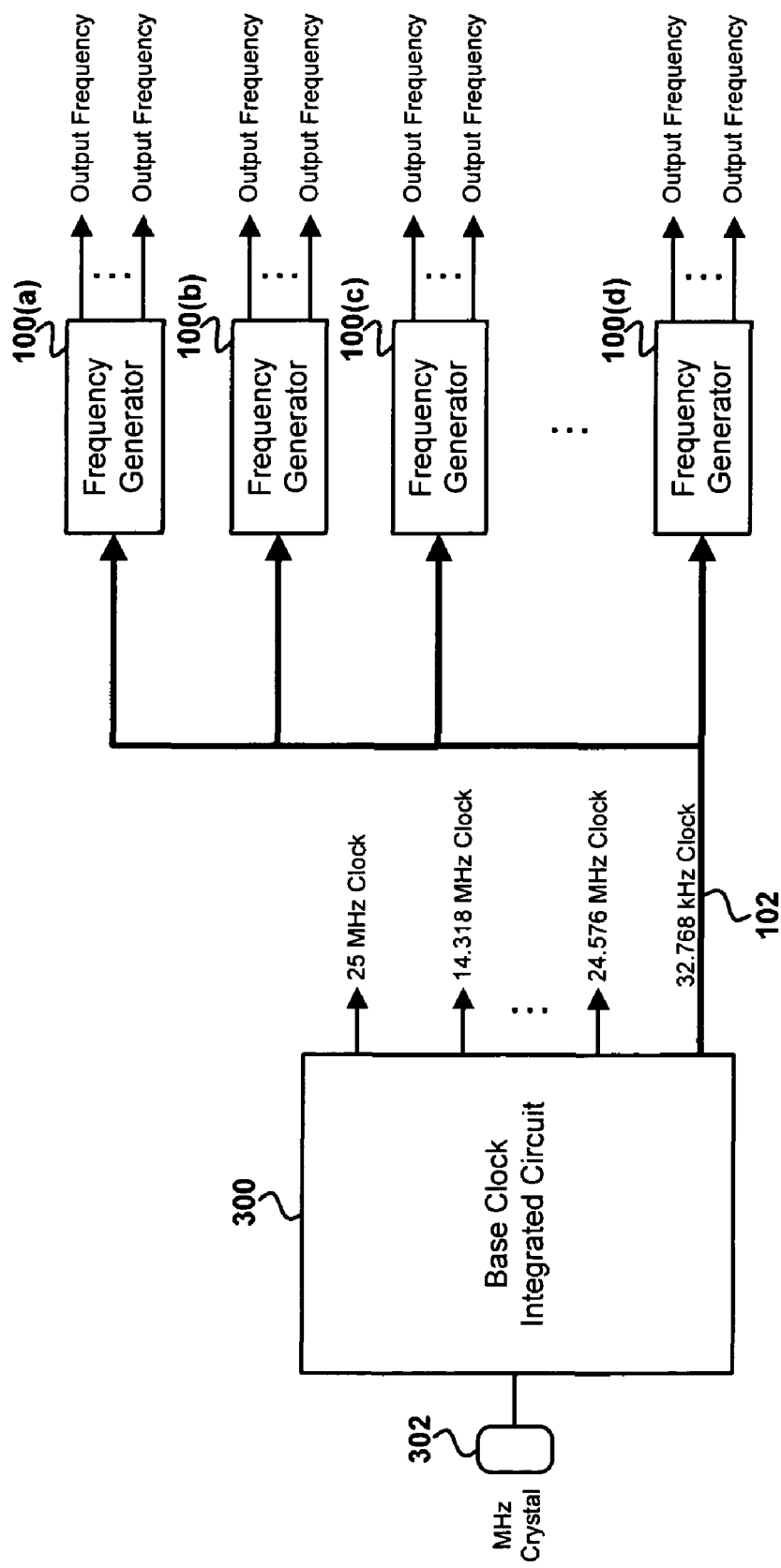
FIG. 3 illustrates a high level functional block diagram of an embodiment of a manner in which a plurality of frequency generator integrated circuits are employed as components in a low frequency trimming system.

FIG. 3 illustrates a high level functional block diagram of an embodiment of a manner in which a plurality of frequency generators 100 are employed as components in a low frequency trimming system. In the given example, reference frequency 102 is generated by base clock integrated circuit 300, which generates various low power, high accuracy output clock frequencies using a single high frequency (e.g., megahertz) crystal source 302. In other embodiments, reference frequency 102 may be generated in any other manner. The low power, high accuracy 32.768 kHz calibration line 102 introduces no electromagnetic interference and is routed to multiple frequency generators 100 located throughout an associated system, e.g., near the components for which they generate various clock frequencies.

In some embodiments, a non-volatile memory is used in conjunction with frequency generator 100. For example, the non-volatile memory may be employed to trim for a particular frequency, better frequency error versus environmental effects performance, and other clocking characteristics such as output buffer strength, calibration rate, synchronous or asynchronous calibration, etc. In various architectures, the non-volatile memory may be integrated on the same die as frequency generator 100, may be on a different die but part of the same package as frequency generator 100, may be a part of an external package, may be connected to another processor or SOC elsewhere in an associated system, etc. In various embodiments, the non-volatile memory may be used with respect to frequency generator 100 for input frequency selection; output frequency selection; frequency trimming the input frequency; frequency trimming the output frequency; frequency trimming the silicon oscillator; frequency trimming for offset, aging, temperature, power supply voltage, integrated circuit stress, or any other electrical or mechanical phenomena that may impact an output frequency; etc. In various embodiments, the non-volatile memory may be a floating gate type of re-programmable memory (e.g., flash, EEPROM, EPROM, etc.), one-time programmable memory, a SONOS type memory, fuse, anti-fuse, bonding wires, IC metal mask, FIB, pseudo non-volatile memory (volatile memory with battery back-up), etc. In some embodiments, the non-volatile memory is not physically located on the integrated circuit of frequency generator 100 but loaded and/or adjusted from an external source. In some cases, for example, the non-volatile memory is located next to a processor, FPGA, or controller used to manipulate frequency generator 100.

In various embodiments, higher levels of integration are achievable by integrating frequency generator integrated circuit 100 with any other analog and/or digital circuitry and/or by combining with other circuitry in multiple die packages. Integrating and/or packaging additional circuitry with frequency generator 100 is often very cost effective, e.g., since higher integration reduces overhead associated with handling, packaging, and testing costs. In some embodiments, frequency generator integrated circuit 100 includes integrated spread spectrum circuitry for EMI reduction. In some embodiments, the reference frequency source that generates reference frequency 102 is integrated into frequency generator integrated circuit 100. In some embodiments, the reference frequency source that generates reference frequency 102 is packaged in the same package as frequency generator integrated circuit 100. In some embodiments, temperature sensor 104 is integrated into frequency generator integrated circuit 100. In some embodiments, a transient temperature detector is integrated into frequency generator integrated circuit 100. In some embodiments, circuitry to correct temperature error in reference frequency 102 is integrated into frequency generator integrated circuit 100. In some embodiments, real time calendar/clock circuitry is integrated into frequency generator 100.

In various embodiments, frequency generator 100 may be used with respect to any appropriate application such as desktop, notebook, and netbook computers; PDAs; cell phones; portable media players; digital cameras; media and/or storage applications; consumer, industrial, medical, automotive, communications, and/or military applications; or any other application in which the benefits of less power, faster turn-on, smaller size, less cost, less aging, etc., are valued.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A frequency generator integrated circuit for generating an output frequency, comprising:

an electronic oscillator configured to generate an oscillator frequency;

calibration circuitry configured to periodically calibrate the electronic oscillator to track an accuracy of a temperature error-corrected reference frequency, wherein the calibration circuitry is configured to calibrate the electronic oscillator to track the accuracy of the temperature error-corrected reference frequency at a first calibration frequency when at a steady state temperature and at a second calibration frequency when at a transient temperature; and circuitry configured to generate the output frequency from the oscillator frequency.

2. The frequency generator integrated circuit of claim 1, wherein the first calibration frequency comprises a frequency that is outside a phase noise bandwidth of interest in an associated system.

3. The frequency generator integrated circuit of claim 1, wherein the first calibration frequency is lower than the second calibration frequency.

4. The frequency generator integrated circuit of claim 1, wherein the first calibration frequency is less than or equal to 2 Hz.

5. The frequency generator integrated circuit of claim 1, wherein the second calibration frequency comprises a megahertz frequency.

6. The frequency generator integrated circuit of claim 1, wherein the electronic oscillator comprises an LC VCO.

7. The frequency generator integrated circuit of claim 1, wherein the oscillator frequency comprises a high frequency.

8. The frequency generator integrated circuit of claim 1, wherein the oscillator frequency comprises a gigahertz frequency.

9. The frequency generator integrated circuit of claim 1, wherein the reference frequency comprises a low frequency.

10. The frequency generator integrated circuit of claim 1, wherein the reference frequency comprises a real time clock frequency.

11. The frequency generator integrated circuit of claim 1, wherein the reference frequency is generated by a crystal.

12. The frequency generator integrated circuit of claim 1, wherein the reference frequency is generated by another integrated circuit.

13. The frequency generator integrated circuit of claim 1, wherein circuitry to temperature error-correct the reference frequency is not a part of the frequency generator integrated circuit.

14. The frequency generator integrated circuit of claim 1, wherein the output frequency comprises a high frequency.

15. The frequency generator integrated circuit of claim 1, wherein the output frequency comprises a megahertz frequency.

16. The frequency generator integrated circuit of claim 1, wherein the output frequency is one of a plurality of output frequencies generated by the frequency generator integrated circuit.

17. The frequency generator integrated circuit of claim 16, wherein each of the plurality of output frequencies is based on the reference frequency.

18. The frequency generator integrated circuit of claim 1, wherein an accuracy of the output frequency is comparable to an accuracy of the reference frequency.

19. The frequency generator integrated circuit of claim 1, wherein the transient temperature comprises a fast thermal.

20. The frequency generator integrated circuit of claim 1, wherein the calibration circuitry comprises one or more counters.

21. The frequency generator integrated circuit of claim 1, wherein the calibration circuitry comprises a frequency-locked loop.

22. The frequency generator integrated circuit of claim 1, wherein the calibration circuitry comprises circuitry to trim the electronic oscillator.

23. The frequency generator integrated circuit of claim 1, wherein circuitry configured to generate the output frequency from the oscillator frequency comprises one or more of a frequency divider, a frequency multiplier, a frequency-locked loop, and a phase-locked loop.

24. The frequency generator integrated circuit of claim 1, further comprising circuitry to detect a transient temperature.

25. The frequency generator integrated circuit of claim 1, further comprising spread spectrum circuitry to reduce electromagnetic interference.

26. The frequency generator integrated circuit of claim 1, further comprising a reference frequency source that generates the reference frequency.

27. The frequency generator integrated circuit of claim 1, further comprising integrated analog and/or digital circuitry.

28. The frequency generator integrated circuit of claim 1, further comprising integrated real time clock circuitry.

29. The frequency generator integrated circuit of claim 1, wherein the frequency generator integrated circuit comprises a component of a low frequency trimming system.

30. A method for generating an output frequency, comprising:
configuring an electronic oscillator to generate an oscillator frequency;
configuring calibration circuitry to periodically calibrate the electronic oscillator to track an accuracy of a temperature error-corrected reference frequency, wherein the calibration circuitry is configured to calibrate the electronic oscillator to track the accuracy of the temperature error-corrected reference frequency at a first calibration frequency when at a steady state temperature and at a second calibration frequency when at a transient temperature; and
generating the output frequency from the oscillator frequency.

31. The method of claim 30, wherein the first calibration frequency comprises a frequency that is outside a phase noise bandwidth of interest in an associated system.

32. The method of claim 30, wherein the first calibration frequency is lower than the second calibration frequency.

33. The method of claim 30, wherein the first calibration frequency is less than or equal to 2 Hz.

34. The method of claim 30, wherein the second calibration frequency comprises a megahertz frequency.

35. The method of claim 30, wherein the electronic oscillator comprises an LC VCO.

36. The method of claim 30, wherein the oscillator frequency comprises a high frequency.

37. The method of claim 30, wherein the oscillator frequency comprises a gigahertz frequency.

38. The method of claim 30, wherein the reference frequency comprises a low frequency.

39. The method of claim 30, wherein the reference frequency comprises a real time clock frequency.

40. The method of claim 30, wherein the reference frequency is generated by a crystal.

41. The method of claim 30, wherein the reference frequency is generated by an integrated circuit.

42. The method of claim 30, further comprising configuring circuitry to temperature error-correct the reference frequency.

43. The method of claim 30, wherein the output frequency comprises a high frequency.

44. The method of claim 30, wherein the output frequency comprises a megahertz frequency.

45. The method of claim 30, wherein the output frequency is one of a plurality of output frequencies.

46. The method of claim 45, wherein each of the plurality of output frequencies is based on the reference frequency.

47. The method of claim 30, wherein an accuracy of the output frequency is comparable to an accuracy of the reference frequency.

48. The method of claim 30, wherein the transient temperature comprises a fast thermal.

49. The method of claim 30, wherein the calibration circuitry comprises one or more counters.

50. The method of claim 30, wherein the calibration circuitry comprises a frequency-locked loop.

51. The method of claim 30, wherein the calibration circuitry comprises circuitry to trim the electronic oscillator.

52. The method of claim 30, wherein circuitry configured to generate the output frequency from the oscillator frequency comprises one or more of a frequency divider, a frequency multiplier, a frequency-locked loop, and a phase-locked loop.

53. The method of claim 30, further comprising configuring circuitry to detect a transient temperature.

54. The method of claim 30, further comprising configuring spread spectrum circuitry to reduce electromagnetic interference.

55. The method of claim 30, further comprising configuring a reference frequency source that generates the reference frequency.

* * * * *